(12) United States Patent
Standing

(10) Patent No.: US 8,368,223 B2
(45) Date of Patent: Feb. 5, 2013

(54) PASTE FOR FORMING AN INTERCONNECT AND INTERCONNECT FORMED FROM THE PASTE

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 1560 days.

(21) Appl. No.: 10/970,165

(22) Filed: Oct. 21, 2004

(65) Prior Publication Data

US 2005/0093164 A1  May 5, 2005

Related U.S. Application Data

(60) Provisional application No. 60/514,095, filed on Oct. 24, 2003, provisional application No. 60/555,794, filed on Mar. 24, 2004.

(51) Int. Cl.
*H01L 23/48* (2006.01)
*H01L 23/52* (2006.01)

(52) U.S. Cl. ............ 257/772; 257/779; 257/E23.017; 257/E23.141

(58) Field of Classification Search .......... 257/772, 257/779, 782, 784, 762, 786, E23.017, E23.141
See application file for complete search history.

(56) References Cited

U.S. PATENT DOCUMENTS

| | | | |
|---|---|---|---|
| 6,889,433 B1 * | 5/2005 | Enomoto et al. | 29/852 |
| 2002/0114726 A1 * | 8/2002 | Soga et al. | 420/557 |
| 2002/0155642 A1 | 10/2002 | Noquil et al. | |

* cited by examiner

*Primary Examiner* — Allison P Bernstein
(74) *Attorney, Agent, or Firm* — Farjami & Farjami LLP

(57) ABSTRACT

A paste for forming an interconnect includes a mixture of binder particles, filler particles and flux material, binder particles having a melting temperature that is lower than that of the filler particles, and the proportion of the binder particles and the filler particles being selected such when heat is applied to melt the binder particles the shape of the paste as deposited is substantially retained thereby allowing for the paste to be used for forming interconnect structures.

20 Claims, 8 Drawing Sheets

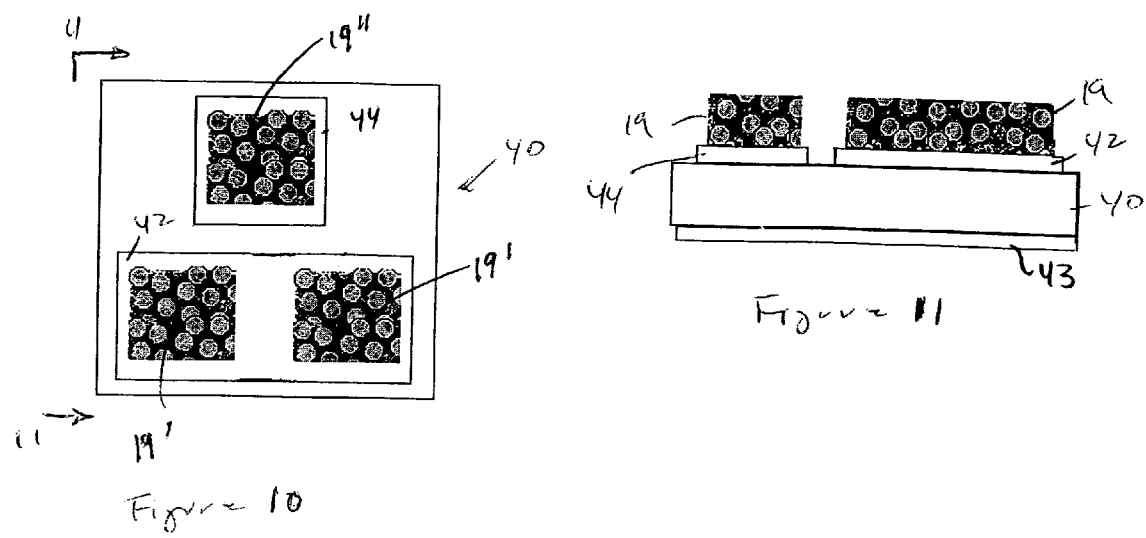
Figure 10
Figure 11
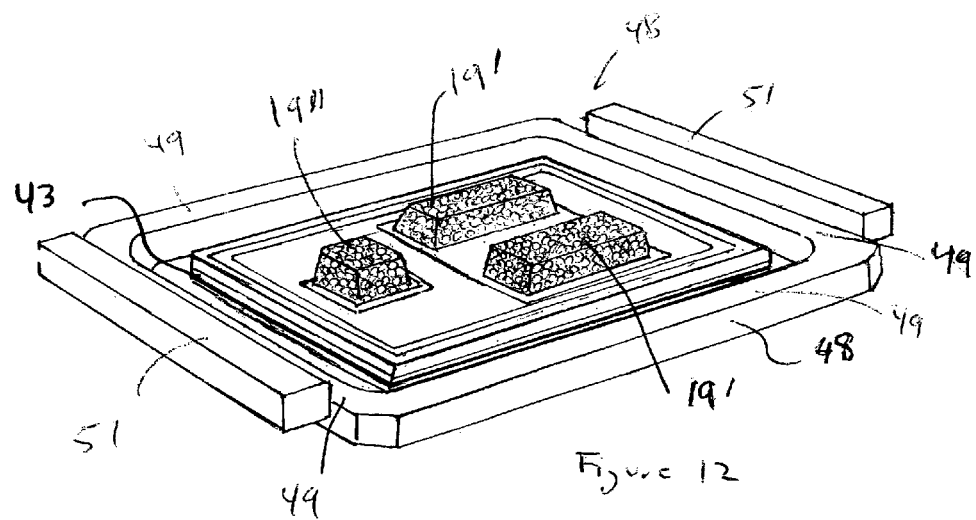
Figure 12

PASTE FOR FORMING AN INTERCONNECT AND INTERCONNECT FORMED FROM THE PASTE

RELATED APPLICATION

The application is based on and claims priority to U.S. Provisional Application No. 60/514,095 filed Oct. 24, 2003, entitled Solder and Solder Process and No Flow/Reflowing Interconnects and U.S. Provisional Application No. 60/555, 794, filed Mar. 24, 2004, entitled Semiconductor Device Package Utilizing Proud Interconnect Material.

FIELD OF THE INVENTION

The present invention relates to semiconductor packaging, and more particularly to an interconnect structure and a paste for forming the interconnect structure.

BACKGROUND OF THE INVENTION

Solder is a conventionally known material for connecting a semiconductor device to a conductive pad on a circuit board. According to a well known technique, solder bumps can be formed on a conductive pad of a circuit board, a component such as a semiconductor die can be placed thereon, and the solder is then reflown in order to connect the component to the conductive pad. Alternatively, the solder bump can be formed on the semiconductor component, the component can be placed on the conductive pad, and the solder reflown to connect the component to the conductive pad.

Referring to FIG. 1 for illustrative purposes, to form a solder bump on a conductive pad 14 of a circuit board 10, first a solder paste 15 is deposited on a portion of conductive pad 14. As shown in FIG. 1, to define the area that receives solder paste 15, a solder mask 12 may be applied to the top surface of circuit board 10 which includes an opening over conductive pad 14.

Referring to FIG. 2, after depositing solder paste 15 over conductive pad 14, solder paste 15 is reflown by applying heat; i.e. by taking the solder paste to its reflow temperature to form a liquidous. After the liquidous is cooled, a solder bump 17 is formed over conductive pad 14. It should be noted that solder bump 17 has a curved outer surface 19. Curved outer surface 19 is due to the surface tension when the solder is reflown, and becomes more curved as the volume of solder is increased. Thus, to join a component and a conductive pad on a circuit board using the conventional technique described herein the stenciling of the solder on the circuit board (or the component) requires strict adherence to certain tolerances which complicates manufacturing.

SUMMARY OF THE INVENTION

According to the present invention a paste is used to form interconnects for electrically connecting components to one another or to conductive pads on a circuit board or the like.

A paste according to the present invention is a mixture of binder particles and filler particles, and, where required, a flux material. According to the present invention binder particles melt at a lower temperature than the filler particles. Furthermore, the respective proportion of the binder particles and the filler particles is such that when binder particles are melted the shape of the paste as deposited does not change substantially but there is enough to glue the filler particles to one another after the binder liquidous is cooled in order to form a structure. A structure so formed can serve as an interconnect.

Thus, a paste according to the present invention can be used to form interconnect structures on a surface, such as an electrode of a semiconductor component or a conductive pad on a circuit board.

An interconnect according to the present invention can cover a large area on, for example, an electrode of a power semiconductor device. Also, such an interconnect can be made proud, i.e. standing above the non-solderable surrounding area, which is advantageous because:

1) It allows the solder fillet to be less critical, which means that the substrate and stencil designs are less important in terms of design and tolerance in that instead of forming a solder joint between two planar surfaces (in which the solderable area is defined by a window within a solder mask) the "proud interconnect" enables the fillet formation to include the edge of the solder interconnect.

2) Fundamentally forming thick interconnects onto the die surface means that the die surface and edge can be covered with an epoxy or any other suitable passivation material, which is advantageous for the following reasons:
   a) The passivation enables insulation between different potentials on the die, allowing for higher voltages and more radical designs.
   b) It is likely to lead to the reduction in the process steps needed to protect the die in certain package types.
   c) It will produce a more rugged device.
   d) It will provide for better environmental protection.
   e) It will reduce critical manufacturing tolerances, and therefore makes the device easier to produce.

Other features and advantages of the present invention will become apparent from the following description of the invention which refers to the accompanying drawings.

BRIEF DESCRIPTION OF THE DRAWINGS

FIG. 10 shows a top plan view of a semiconductor die modified to include interconnects on electrodes thereof.

FIG. 11 shows a side plan view of the semiconductor die shown in FIG. 10 seen in the direction of the arrows 11-11.

FIG. 12 shows a perspective view of a first variation of a package formed with a semiconductor die which includes interconnects formed according to the present invention.

DETAILED DESCRIPTION OF THE INVENTION

An electrically conductive paste according to the present invention includes a mixture of binder particles, and filler particles. In a preferred embodiment of the present invention, the binder particles are solder powder, and the filler particles are conductive particles dispersed throughout, or mixed in with the solder powder. The preferred embodiment further includes a solder flux material.

According to an aspect of the present invention, the proportion of the binder particles relative to the proportion of the filler particles is such that when the binder particles melt, there will be sufficient binder to fuse the filler particles, i.e., "glue" the filler particles together. However, the respective portions will be such that when binder particles are melted the shape of the paste as deposited will not change substantially. That is, the interconnect will substantially have the same shape as the paste when it is deposited.

The filler particles used in a paste according to the present invention are preferably spherically shaped, although other shapes such as cubes and parallelepipeds, or the like may also be used. It should be noted that to practice the present invention, the shape of the particles does not need to be perfect geometrically. That is, for example, a spherical shape as referred to herein need only be generally sphere-like rather than spherical perfectly to be within the present invention. Thus, the shape of particles as described herein should not be understood to restrict the invention to perfect geometric shape.

In the preferred embodiment, the binder has a high melting temperature. Solders formed from the combination of 95% Sn and 5%, Sb (by weight), or the combination of 95.5% Sn, 3.8% Ag, and 0.7% Cu (by weight) are examples of solders suitable to be used as binder material in a paste according to the present invention.

A suitable material for forming the fillers is copper. Other suitable materials for forming the fillers are nickel and tin-silver.

Figure 1:
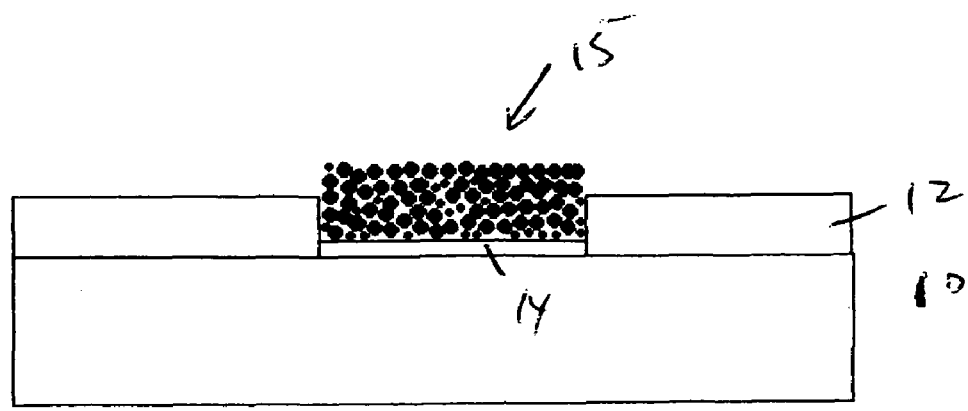
FIGS. 1 and 2 illustrate a technique for forming solder bump interconnects according to the prior art.
Figure 2:
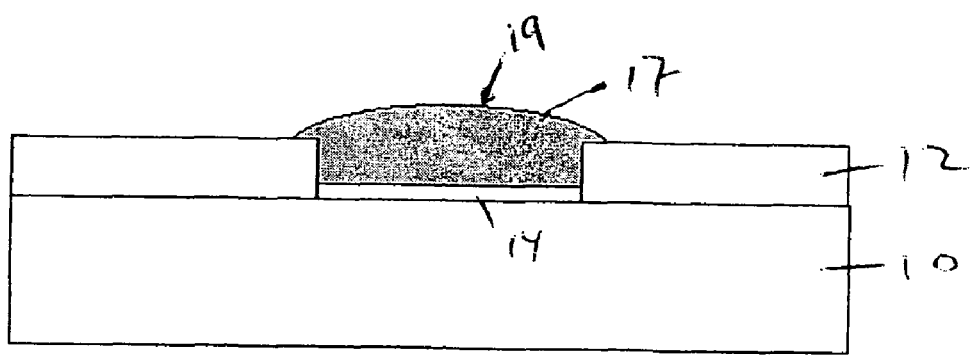
Figure 3:
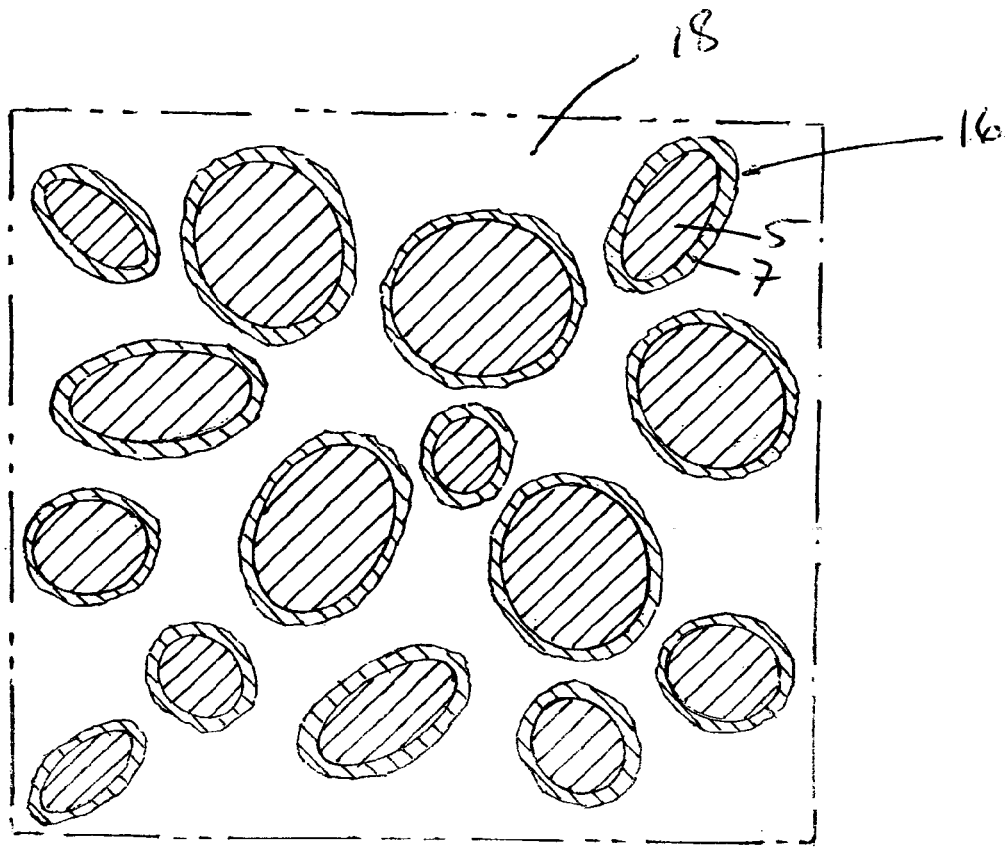
FIG. 3 illustrates a portion of the body of an interconnect formed with a paste according to the present invention.

Referring to FIG. 3, filler particles 16 may be formed of one material 5 and coated with another material 7. For example, sphere-like copper particles, when used as conductive fillers, may be plated with a nickel barrier and passivated with tin or silver. Suitable binders to be used with sphere-like copper particles are tin-silver solders, high lead solders, or a tin-lead solder.

Sphere-like nickel particles, when used as conductive fillers, may be passivated with tin or silver. A suitable binder for fusing sphere-like nickel particles may be any one of the solders listed above.

A suitable binder for use with tin-silver filler particles may be a tin-bismuth solder.

In a preferred composition, fillers may be spherical or sphere-like and may constitute 5-40% of the total weight of the mixture, and the binder may be solder in powder form and constitute 50-85% of the total weight of the mixture. In this preferred composition, about 10% of the total weight may be a solder flux which may be a resin with mild activation. Preferably, the filler particles are anywhere between 15 μm-65 μm and the particle size of the solder binder may be anywhere between 25 μm-45 μm.

One specific example of a paste according to the present invention includes 31.5% (by weight) of silver coated nickel particles, 58.5% (by weight) of SAC (Tin-Silver-Copper) or SA (Tin-Silver) alloys as binder. The SAC composition may be 95.5% Sn, 3.8% Ag, and 0.7% Cu (by weight), while SA composition is 96% Sn and 4% Ag (by weight). In this example, 10% of the total weight may be flux material.

Another example may be a high flow derivative of the previous example having anti-slump properties. Such a solder paste may include 5% (by weight) of silver coated nickel spheres, 85% SAC or SA, and 10% (by weight) of flux.

A paste according to the present invention is particularly useful for forming relatively flat large area interconnects on surfaces, such as conductive pads on a substrate, or an electrode of a semiconductor die. An advantageous characteristic of a paste according to the present invention is that when it is formed to a shape, it substantially retains that shape after the application of heat to reflow, i.e. melt, the binder.

Figure 4:
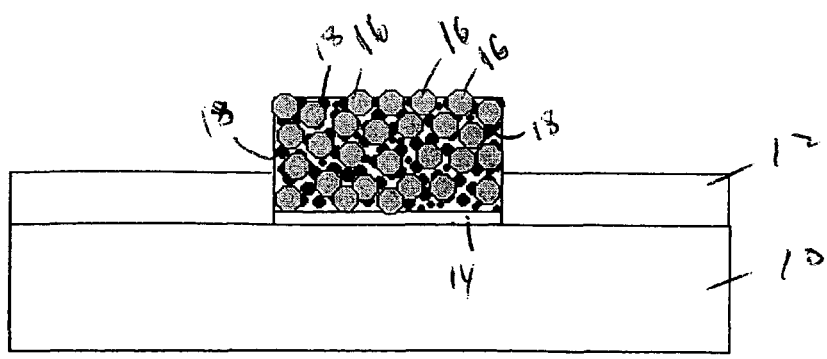
FIGS. 4 and 5 illustrate a technique for forming interconnects according to the present invention.
Figure 5:
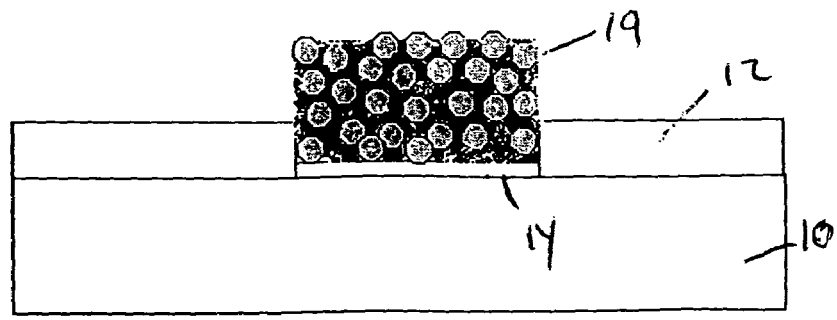

Referring now to FIGS. 3, 4 and 5, a process for manufacturing an interconnect according to the present invention involves depositing an amount of a paste according to the present invention on a surface. Specifically, for example, a desired amount of a paste according to the present invention may be deposited over a conductive pad 14 on a circuit board 10. Circuit board 10 may have a solder mask 12 disposed thereon surrounding conductive pad 14. A paste according to the present invention which includes spherical or sphere-like filler particles 16 and particles of an electrically conductive binder 18 is deposited on conductive pad 14 and extends above solder mask 12. The paste may be so deposited to have a relatively flat top as shown in FIG. 4. In the preferred embodiment, a paste according to the present invention may be deposited using a stenciling or printing method, although other methods of deposit are considered within the invention.

After depositing the paste, heat is applied to cause binder particles 18 to melt. Thus, if solder is used as a binder, heat is applied until the solder is reflown, i.e. the solder is taken to its reflow temperature. Since, binder particles 18 have a much lower temperature than filler particles 16, filler particles 16 remain solid. However, binder particles 18 melt and wet filler particles 16. Once the temperature is lowered below the melting temperature of binder particles 18, filler particles 16 are "glued" to one another, thereby forming an integral structure as shown in FIGS. 3 and 5.

According to one aspect of the present invention, the proportion of binder particles is so selected that there will not be enough liquidous to flow, but there will be enough liquidous to glue filler particles 16 together to form an integral structure suitable to serve as an interconnect.

Advantageously, it has been found that a paste according to the present invention substantially retains its shape as deposited after the binder has melted and solidified. Thus, a paste according to the present invention is ideal for forming interconnects with exterior surfaces of reduced curvature and/or reduced hot-slumping property for electrical connection to external elements, which is a desirable characteristic for an interconnect.

Figure 6:
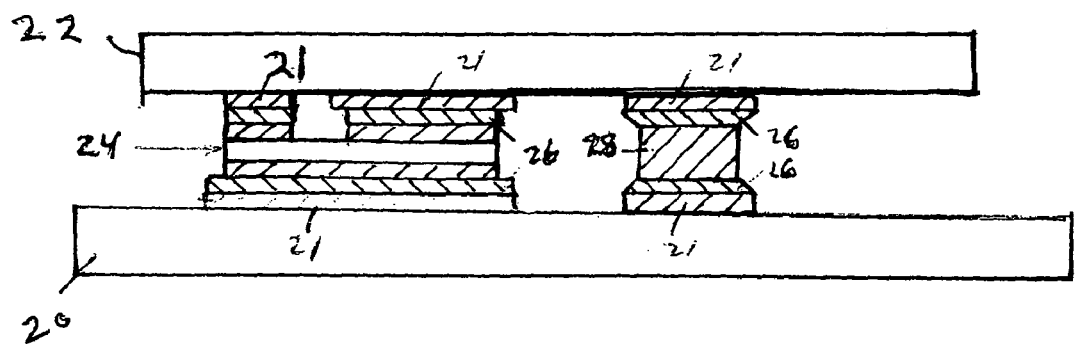
FIG. 6 shows a cross-sectional view of a package according to prior art.

Referring now to FIG. 6, a package according to the prior art includes a first circuit board 20, a second circuit board 22, a semiconductor die 24 which is disposed between first and second circuit boards 20, 22 and electrically connected to respective conductive pads 21 on each circuit board 20, 22 by solder 26 or the like. A package as shown in FIG. 6 also includes an interconnect 28, which may be a copper slug, that interconnects first and second circuit boards 20, 22 through respective layers of solder 26 or the like. A more detailed description of a package according to FIG. 6 is shown in published U.S. patent application Ser. No. 2004/0119148A1, assigned to the assignee of the present invention the subject matter of which is hereby incorporated by reference.

According to another aspect of the present invention, interconnect 28 may be formed according to the present invention. Specifically, referring to FIG. 7, an interconnect structure 19 may be used instead of an interconnect 28 in a package according to FIG. 6.

Figure 8:
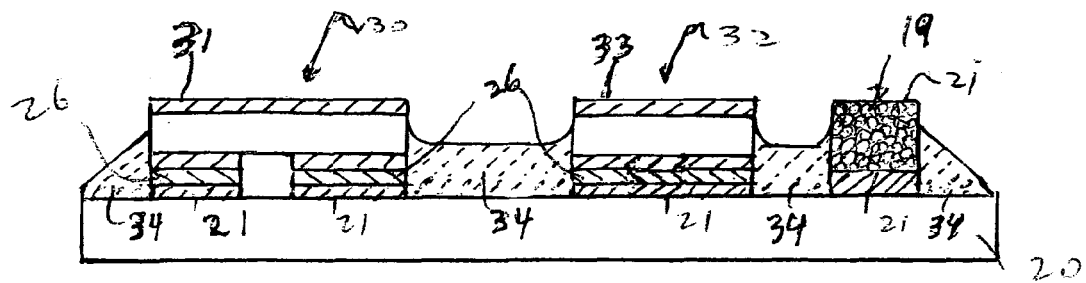
FIG. 8 shows a side plan view of a second embodiment of a package that includes an interconnect according to the present invention.

Referring now to FIG. 8, in an alternative embodiment, an interconnect 19 may be used for external connection. Specifically, an interconnect 19 may be formed according to a method of the present invention to have a connection surface 21. Connection surface 21 is left free so that it may make connection to an external element such as a conductive pad on a circuit board. Note that in the example shown by FIG. 8, a first semiconductor component 30 and a second semiconductor component 32 are also connected to respective conductive pads 21 on circuit board 20 by a layer of solder 26. Semiconductor components 30, 32 also include free connection surfaces 31, 33, which are preferably coplanar with connection surface 21 of interconnect 19. Similar to connection surface 21, free connection surfaces 31, 33 of semiconductor components 30, 32 may be adapted for direct connection to conductive pads of a circuit board. For example, free surfaces 31, 33 may be made solderable.

Semiconductor components 30, 32 may be power MOSFETs, diodes, IGBTs, or any other semiconductor device such as a control IC, or the like, and circuit board 20 may be a thermally conductive circuit board such as an insulated metal substrate (IMS). It should be noted that in the embodiment shown by FIG. 8, insulation 34 may be formed in the gaps between semiconductor components 30, 32 and semiconductor components and interconnect 19. Insulation 34 may be composed of, for example, polyimide, BCB, epoxy based dielectrics silicon polyesters, or organopolysiloxanes.

Figure 7:
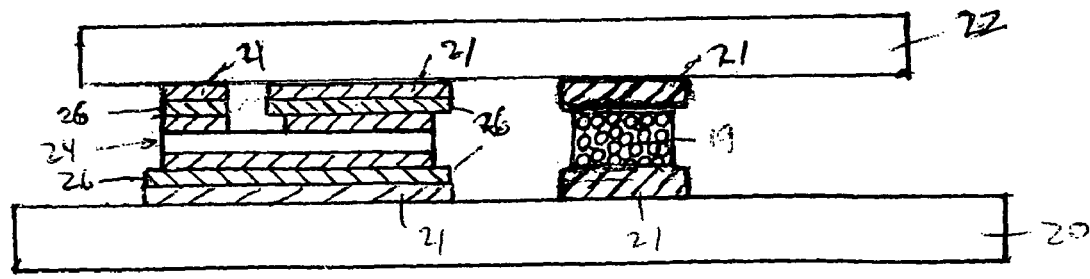
FIG. 7 shows a cross-sectional view of a first embodiment of a package modified to include an interconnect according to the present invention.
Figure 9:
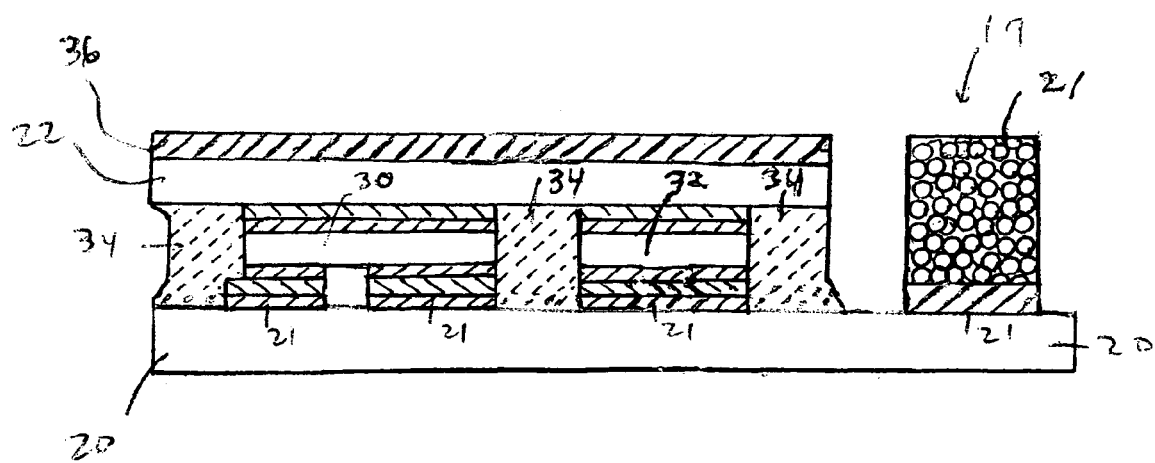
FIG. 9 shows a side plan view of a third embodiment of a package that includes an interconnect according to the present invention.

Referring now to FIG. 9, in another embodiment, which resembles the embodiment shown in both FIGS. 6, and 7, a package may include an interconnect 19 formed according to the present invention on a first circuit board 20, and a second circuit board 22 may be provided with a solderable free surface 36. Solderable free surface 36 may be electrically connected to semiconductor components 30, 32 and serve as an external connection surface for electrically connecting semiconductor components 30, 32 to respective external elements such as respective conductive pads on a circuit board. Solderable free surface 36 may be electrically connected to semiconductor components 30, 32, through vias (not shown) or the like in circuit board 22 as is conventionally known. Preferably, solderable free surface 36 and free connection surface 21 of interconnect 19 are coplanar to facilitate the surface mounting of a package according to FIG. 9.

Referring now to FIGS. 10 and 11, an interconnect 19 according to the present invention can be formed on an electrode of a semiconductor device such as a power MOSFET 40. Specifically, for example, an interconnect 19 can be formed on source electrode 42 and gate electrode 44 of a power MOSFET 40.

According to an aspect of the invention, a plurality of MOSFETs 40 can be formed in a wafer, a paste according to the present invention can be formed on respective electrodes of power MOSFETs 40 while in the wafer, and then subjected to heat to form interconnects 19. Thereafter, power MOSFETs 40 may be singulated by, for example, sawing or some other conventional method to obtain individual power MOSFETs, such as the one shown by FIGS. 10 and 11. Thus, interconnects 19 can be formed at wafer level prior to the packaging of power MOSFET 40.

Referring next to FIG. 12, a power MOSFET 40, according to the present invention may be packaged in a conductive can 48 according to an alternative embodiment. Specifically, drain electrode 43 of a power MOSFET 40 may be electrically connected to the inside surface of can 48 to form a new chip-scale package similar to a prior art package disclosed in U.S. Pat. No. 6,624,522 the disclosure of which is incorporated by reference.

In a first variation, MOSFET 40 includes interconnect 19' formed according to the present invention on source electrode 42 of MOSFET 40, and interconnect 19" on gate electrode 44 of MOSFET 40 without any passivation. Thus, there will be no passivation on the free surface (surface not covered by interconnects 19', 19") of power MOSFET 40, and there will be a gap between the edges of power MOSFET 40 and the surrounding walls 49 of can 48 as seen in FIG. 12. It should be noted that MOSFET 40 may be made thinner than the depth of can 48 in that the height of interconnects 19', 19" may be designed to ensure coplanarity with external connection surfaces 51 of can 48, which are used to electrically connect can 48 to, for example, conductive pads on a circuit board. The option of reducing the thickness of MOSFET 40 is advantageous in that it may allow reduction of its ON resistance.

Figure 13:
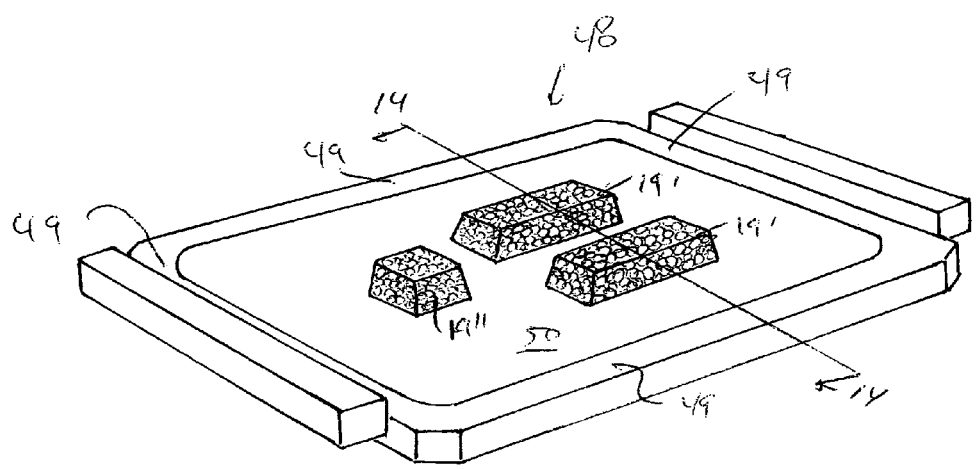
FIG. 13 shows a perspective view of a second variation of a package formed with a semiconductor die which includes interconnects formed according to the present invention.

Referring now to FIG. 13, in a second variation, a passivation structure 50 is formed over the free surface of power MOSFET 40, which is preferably extended to cover the gap between the edges of power MOSFET 40 and surrounding walls 49 of can 48. Passivation structure 50 is preferably formed from a silicon organic polymer material, such as silicon/epoxy or silicon/polyester which belong to the family of organopolysiloxanes. The use of such materials is advantageous due to their high temperature and moisture resistance. A preferred material is the combination of silicon epoxy, silicon polyester, acrylate, a thermal catalyst, and a UV monomer partial catalyst. A passivation formed from silicon epoxies or silicon polyesters is preferred because it is highly resistant to solvents and other chemicals, and provides high levels of both environmental and dielectric protection at a very modest thickness, e.g. a few microns.

Figure 14:
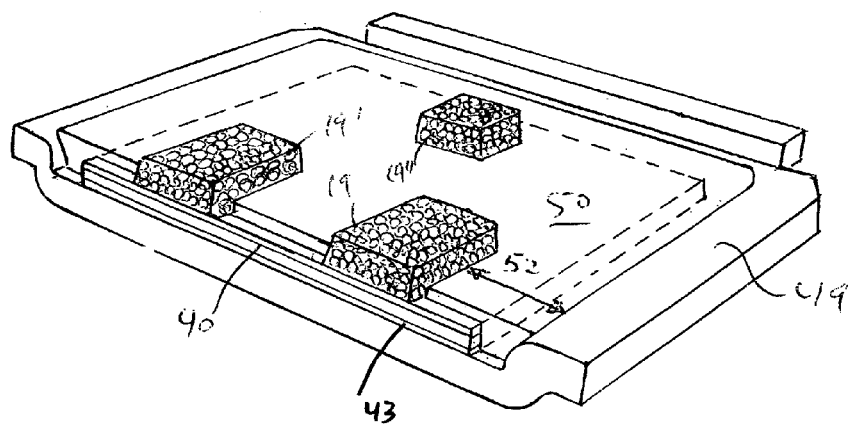
FIG. 14 shows a cross-sectional view of the package shown by FIG. 13 along line 14-14 viewed in the direction of the arrows.
Figure 15:
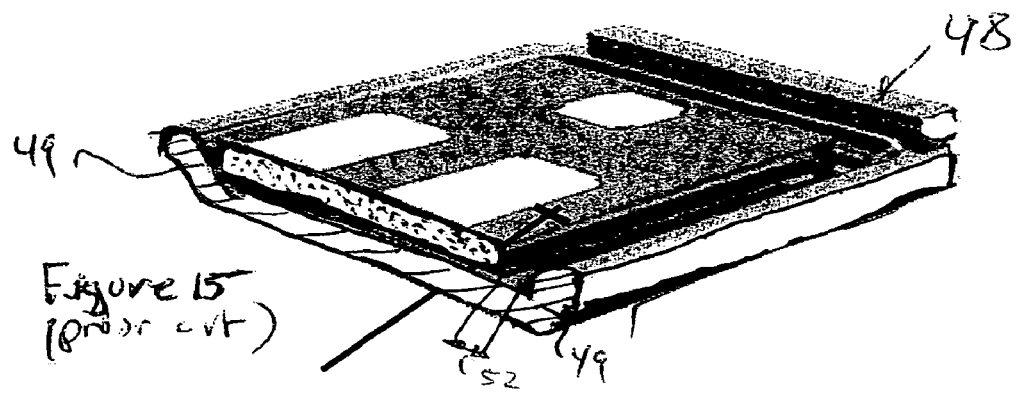
FIG. 15 shows a cross-sectional view of a package according to the prior art.

Referring to FIG. 14, it should be appreciated that when passivation structure 50 is formed, tracking distance 52 becomes the distance between an interconnect 19' and the closest wall 49 of can 48. Thus, compared to a prior art package (see FIG. 15) tracking distance 52 is wider in that in the prior art package tracking distance 52 is the distance between the edge of the power MOSFET and the electrodes disposed on the die surface. The increase in the width of tracking distance 52 enables can 48 to be used with power MOSFETs of voltage ratings higher than 100V when an small can is used and even 300V or higher power MOSFETs in other types of cans. Furthermore, an arrangement, such as the one shown by FIGS. 12 and 13, allows for larger pads on low voltage devices, which improves the thermal characteristics, and the ON resistance (Rdson) of the package, and reduces the current density in the solder joints when the package is installed.

In a preferred embodiment, interconnects 19', 19" in a package according to FIGS. 12 and 13 are formed from a paste formulated with a lead-free solder as a binder, and spherical or sphere-like nickel particles which are coated with silver as filler particles. A preferred lead free solder alloy may be composed of 96% Sn, 4% Ag, 0.7% Cu (by weight). In addition, in the preferred embodiment the spherical nickel particles may have a mean diameter of 45 microns. It should be noted that although nickel particles are spherical in shape, the silver coating may render the exterior surface thereof irregular.

The combination of silver-plated nickel spheres and tin-silver based solder is preferred for at least the following reasons:

1. The solder alloy picks up additional silver from the silver coated nickel particles during the reflowing process, which changes the composition in the solder alloy. The change in composition results in an elevated fully liquid temperature for the solder, which is advantageous as it means that the solder does not become fully liquid during secondary soldering of the interconnect. Thus, the interconnect maintains its shape after it is joined to a conductive pad with a layer of solder.

2. The nickel particles are very hard and can form an effective barrier for strengthening interfaces. A paste according to the invention effectively forms a conglomerate and is therefore more resistant to flexing and deformation than the base solder, i.e. binder material. That is, it is stronger than the base solder. However, it is also effectively more brittle than the base solder and when pushed outside its elastic range it may propagate minor failure sites within its body. Whereas conventional lead-free solders tend to feed the stress into the solder interface layers, an interconnect according to the present invention absorbs the stress within its body. Therefore, in many cases, an interconnect according to the present invention acts as a semi-sacrificial layer to the surface it has joined.

A package according to the variations shown in FIGS. 12 and 13, is first formed by forming interconnects 19',19" on respective electrodes of a power MOSFET 40 prior to mounting the power MOSFET on the interior surface of can 48. Specifically, first, a plurality of power MOSFETs 40 are formed in a wafer. Thereafter, interconnects 19' are formed on source electrodes 42 of power MOSFETs 40, and interconnects 19" are formed on gate electrodes 44 of power MOSFETs 40. Preferably, to form interconnects 19',19" a paste according to the present invention is deposited through a stencil onto source electrodes 42 and gate electrode 44 of each MOSFET 40 respectively. Using a stencil is a well known process in the manufacturing of printed circuit boards and is also widely used for forming solder balls on conventional flip-chip type devices. Alternatively, the paste for forming interconnects 19',19" according to the present invention could be deposited using any other method that would result in the paste being shaped during the deposition, such as solder casting or molding.

Preferably, a wafer processed according to the present invention does not include any passivation schemes over and above those generally used on the die. However, the process will not exclude wafers that have been treated with all currently available passivations used in the manufacture of power semiconductor devices.

After depositing the paste the wafer is subjected to heat in order to reflow the binder. Preferably, the wafer is heated in a convection reflow oven, which is a process used typically in printed circuit board assembly. Preferably the convection oven will run a staged reflow profile that will take the solder paste to the full reflowing temperature. This operation may be carried out under an environment of air or nitrogen.

Figure 17:
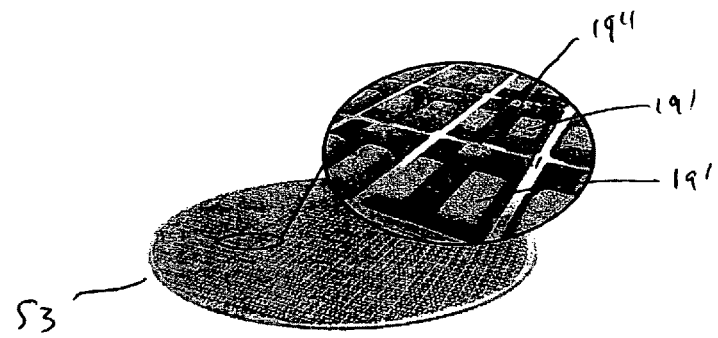
FIG. 17 illustrates a wafer containing die prepared to have interconnects according to the present invention.

After reflowing there will be solder flux residual left on the wafer. The flux residual is then removed using preferably an ultrasonic board-cleaning machine. A preferred machine for removing the solder flux residual uses an appropriate solvent that is in a liquid sump at one side of the machine and is held in vapour-phase at the other side of the machine. Preferably, the majority of the solder flux residual is removed in the liquid sump and the final clean is carried out in the vapour-phase. This process ensures that the wafers have very little contamination left thereon after cleaning. FIG. 17 illustrates a wafer 53 having die therein prepared to include interconnects 19', 19" according to the present invention.

A paste according to the present invention is designed to substantially retain its shape as deposited after its binder has been reflown. Thus, for example, if the print aperture of the instrument for depositing the paste forms a cube of a given height, then the interconnect formed after reflowing the binder retains a form substantially similar to the shape of the cube as deposited. It should be noted that there would inevitably be some change in the shape after reflowing the binder. However, the change in shape would not adversely affect the performance of the interconnect.

After the power MOSFETs 40 in the wafer have interconnects 19',19" formed on respective electrodes thereof, the wafer may be diced using any available method of dicing, for example, sawing with standard diamond impregnated blades, or laser sawing. The dicing results in individual discrete power MOSFETs.

After power MOSFETs 40 have been singulated, each can be electrically connected to the interior surface of a respective can 48 by a conductive adhesive, such as silver filled epoxy or solder, to form a package. To perform this step each individual power MOSFET may be picked up by an automatic pick and place machine and placed inside a respective can 48. The conductive adhesive, e.g. silver filled epoxy, may be deposited inside each can prior to placing a power MOSFET 40 therein. After placing a MOSFET 40 inside a can 48 a curing step is carried out to cure the conductive epoxy.

It should be noted that the pick tips of a conventional pick and place machine may have to be modified to clear interconnects 19',19". Apart from the modified pick-up tips, the pick and place step can be carried out according to conventionally known techniques.

It should be noted that while silver filled epoxy is preferred other materials such as soft solders, or new conductive materials based on carbon and graphite may be used without deviating from the present invention. In addition, electrically isolating die-attach materials such as epoxies or polyimides may also be used in instances when electrical connectivity is not desired. For example, when a power IC is disposed within a can by itself or with a power device, when a lateral power IC or a flip-chip power device is used, or when multiple devices are disposed in a common can an insulating die-attach material may be used to electrically insulate one or more of the devices from the can, while still taking advantage of its thermal properties.

As is known, a purpose of can 48 is to form the third connection necessary for the current through power MOSFET 40. This connection is generally required in this type of device to provide a good path for both thermal and electrical conduction. Currently, the material preferred for can 48 is copper but other metals may also be considered. In addition to metals, metal matrix or composites as well as carbon and graphite materials may be utilized to form this connection. The form and function of can 48 may also vary from application to application.

According to one aspect of the present invention, can 48 includes a gold layer as its exterior finish. This is an improvement over some prior art packages in which the can is finished with silver. It has been found that due to ionic migration silver on the can will promote dendrite formation between the can and the semiconductor device contained therein, thereby shorting the two and rendering the package inoperative. Finishing can 48 with gold avoids such a problem. In a preferred embodiment, the gold finish may be 0.05-0.2 μm thick and it may be immersion deposited on the can.

It should be noted that a package according to FIG. 12 is formed after the conductive epoxy is cured. However, to form a package according to the variation shown by FIG. 13, the material for forming passivation 50 is deposited over exposed portions of MOSFET 40 through single-needle dispensing, multi-needle dispensing, or jetting technology, which is a more accurate and flexible approach. After depositing the passivation material, a curing step is carried out to form passivation 50.

It should be noted that it is not necessary for passivation 50 to terminate at walls 49 of can 48. Rather, passivation 50 may be extended over walls 48, especially when ink jet technology is employed to deposit passivation 50. The extension of passivation 50 over walls 49 of can 48 will further increase the tracking distance.

Thus, to summarize, a process for manufacturing a package as shown in FIGS. 12 and 13 includes the following sequence of steps:

Passivate wafer with organopolysiloxane, or another suitable passivation.
Print wafer with paste according to the present invention.
Reflow paste on wafer.
Clean flux residual.
Dice wafer.
Die bond to the interior of can.
Cure conductive adhesive to attach die.
Deposit passivation material (second variation) (edge of die, gap between the die and can, edge of can).
Cure passivation material (second variation).

Alternatively, the conductive adhesive for bonding the die to the can may be a solder. If so, the process may include a cleaning step after the solder is reflown.

The following can be yet another alternative process for manufacturing a package according to the present invention.

Passivate wafer with organopolysiloxane material, or any suitable passivation.
Dice wafer.
Die bond to interior of can with conductive adhesive.
Cure die bond adhesive.
Deposit paste on die surface electrodes.
Reflow paste on electrodes.
Clean flux residual.
Deposit organopolysiloxane material (edge of die, gap between the die and the can, and edge of can).
Cure passivation.

Alternatively, the conductive adhesive for bonding the die to the can may be solder. In this case, however, no extra flux cleaning will be required in that both the solder and the paste according to the present invention are reflown in the same step.

A package according to the variation shown by FIG. 13 is more rugged than the prior art package (see FIG. 15) due at least in part to a recessed die that is thickly coated with a passivation layer which is highly resistant to both chemical and mechanical damage. Furthermore, a relatively thick interconnect formed from a paste according to the present invention also now serves to protect the contact areas of the die, i.e. the gate electrode and the source electrode.

Also, the increased solder contact height and the combination of materials used in the formation of an interconnect according to the present invention, and the secondary soldering process, result in improvements in thermal cycling.

Furthermore, the process for manufacturing a package according to the variations shown in FIGS. 12 and 13 allows for the use of more diverse construction materials compared to the prior art technique, which means it is now possible to easily produce a device using a can 48 as shown herein, and as existing in the prior art, which has no exposed silver. That is, passivation 50 can cover and thus seal the silver within the package. Furthermore, when solder is used as die attach material instead of silver epoxy, the silver may be effectively removed.

Moreover, having thinner die and larger contact areas will enable improved ON resistance and thermal performance over the prior art.

In addition, the thickness of the die does not have to match the depth of can 48. Thus, a die having a thickness that is different from the depth of can 48 may be packaged within the same can as that used in the prior art when an interconnect according to the present invention is used to bring all die related terminations into the same plane.

Also, a package according to the variation shown in FIG. 13, gains greater distances between contacts and areas of different potential, which allows for higher voltage die compared to the prior art.

An additional advantageous result is that a greater area of the die can now be utilized for connection in that the contacts, e.g. the gate electrode and the source electrode, can be moved much closer to the edge of the die than was previously possible in the prior art. As a result lower ON resistance can be achieved, as a reduction in top metal spreading resistance will be realized. More importantly the boundary on die size dictated as a result of current densities within the solder joint will be favorably moved.

Figure 16:
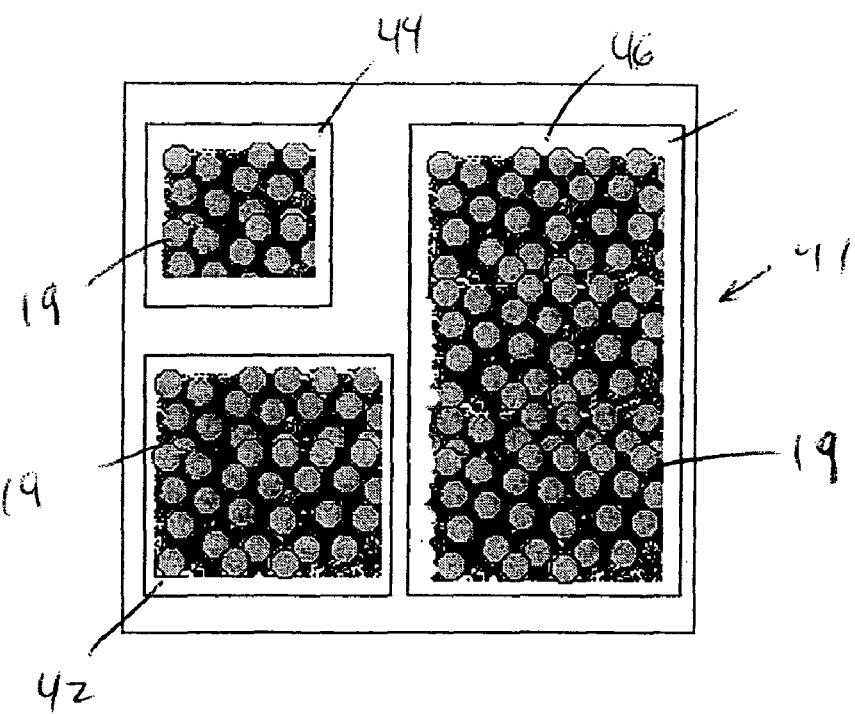
FIG. 16 shows a top plan view of a flip-chip semiconductor device which includes interconnects formed according to the present invention.

In an alternative embodiment, the formation of interconnects 19 can be applied to electrode of a flip-chip type MOSFET 41, which includes a drain electrode 46, as well as, gate electrode 44 and source electrode 42 on the same surface. An example of such a device is illustrated by FIG. 16. It should be noted that advantageously a flip-chip type power MOSFET 41 may also be manufactured at wafer level, and then singulated prior to packaging.

Figure 18A:
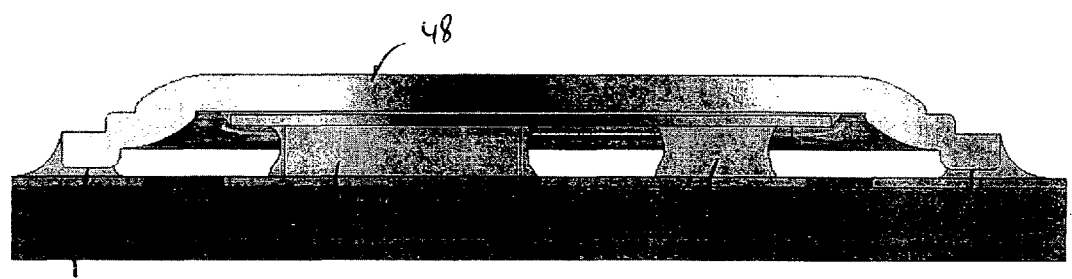
FIG. 18A illustrates a cross-sectional view of a package according to the prior art as connected to a circuit board.
Figure 18B:
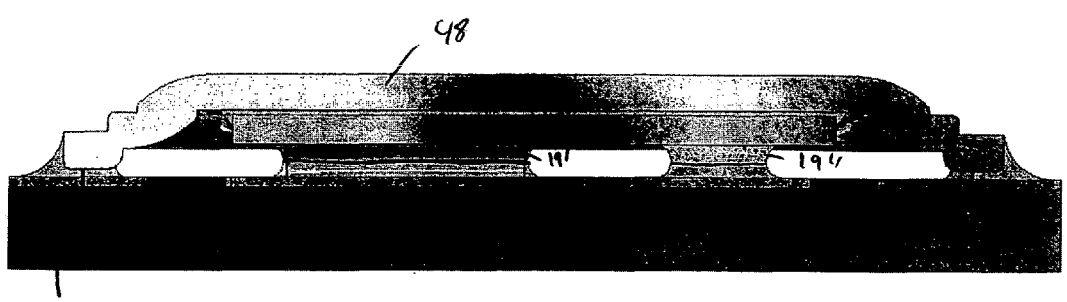
FIG. 18B illustrates a cross-sectional view of a package according to the present invention as connected to a circuit board.

Referring now to FIGS. 18A-B, in a package according to the prior art the connection between an electrode of a die and a conductive pad on a circuit is made through a solder mass 57 (FIG. 18A). Thus, the die must be roughly the depth of can 48 so that it may be coplanar with connection surfaces 51. As a result, the thickness of the die is limited by the depth of can 48. On the other hand, when an interconnect 19',19" according to the present invention is used (FIG. 18B), the depth of can 48 is no longer a limitation. Thus, thinner die may be used in a package according to the present invention. Such a features makes it possible to use thin die such as IGBT die with cans 48 of the prior art depth. Also, it should be noted that when interconnects 19',19" are used there will be a larger standoff between the die and the circuit board. For example, the standoff may be changed from 100 microns (solder mass 57 as connector according to prior art) to 200 microns. The increase in the standoff has been found to improve the fatigue resistance of the package compared to that of the prior art packages.

In yet another alternative embodiment, interconnects 19', 19" can be replaced with an interconnect formed from a solder alloy only which extends through passivation 50, thus taking advantage of the beneficial properties achieved by having passivation 50 as described herein. The solder alloy used may be tin-silver-copper alloy (e.g. 95.5% Sn, 3.8% Ag, 0.7% Cu (by weight)), tin-silver alloy (96% Sn, 4% Ag (by weight)), or 90% Sn, 10% Ag (by weight)), or high lead solder alloy (95% Pb, 5% Sn (by weight)).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A conductive paste comprising:
   electrically conductive binder particles; and
   a plurality of filler particles mixed with said binder particles, wherein said electrically conductive binder particles comprise 50-85% of the total weight of the composition, and said filler particles comprise 5-40% of the total weight of the composition.

2. A conductive paste according to claim 1, further comprising a flux material, said flux material comprising the balance of the total weight of the composition.

3. A conductive paste according to claim 2, wherein said flux material comprises 10% of the total weight of the composition.

4. A conductive paste according to claim 1, wherein said binder particles are 15 μm-50 μm wide.

5. A conductive paste according to claim 1, wherein said filler particles are 15 μm to 65 μm wide.

6. A conductive paste comprising:
   electrically conductive binder particles; and
   a plurality of silver-coated filler particles mixed with said binder particles, wherein said electrically conductive binder particles comprise 50-85% of the total weight of the composition, and said filler particles comprise 5-40% of the total weight of the composition.

7. The conductive paste of claim 6, wherein said binder particles are comprised of solder.

8. The conductive paste of claim 7, wherein said solder is comprised of tin-silver solder.

9. The conductive paste of claim 8, wherein said tin-silver solder is a composition substantially consisting of 95.5% Sn, 3.8% Ag, and 0.7% Cu by weight.

10. The conductive paste of claim 7, wherein said solder is a composition substantially consisting of 95% Sn and 5% Sb by weight.

11. The conductive paste of claim 7, wherein said solder is a high lead solder.

12. The conductive paste of claim 7, wherein said solder is a tin-lead solder.

13. The conductive paste of claim 6, wherein said filler particles are substantially spherical.

14. The conductive paste of claim 6, wherein said filler particles arc substantially parallelepipedal.

15. The conductive paste of claim 6, wherein said filler particles are comprised of copper.

16. The conductive paste of claim 6, wherein said filler particles are comprised of nickel.

17. A conductive paste comprising:
    electrically conductive hinder particles; and
    a plurality of tin-silver filler particles mixed with said binder particles, wherein said electrically conductive binder particles comprise 50-85% of the total weight of the composition, and said filler particles comprise 5-40% of the total weight of the composition.

18. The conductive paste of claim 17, further comprising a flux material, said flux material comprising the balance of the total weight of the composition.

19. The conductive paste of claim 18, wherein said flux material comprises 10% of the total weight of the composition.

20. The conductive paste of claim 17, wherein said binder particles arc comprised of tin-bismuth.

* * * * *